United States Patent
Hu

(10) Patent No.: US 11,600,464 B2
(45) Date of Patent: Mar. 7, 2023

(54) APPARATUS AND METHOD FOR REDUCTION OF PARTICLE CONTAMINATION BY BIAS VOLTAGE

(71) Applicant: ADVANCED ION BEAM TECHNOLOGY, INC., Hsinchu (TW)

(72) Inventor: Shao-Yu Hu, Hsinchu (TW)

(73) Assignee: ADVANCED ION BEAM TECHNOLOGY, INC., Hsinchu (TW)

( * ) Notice: Subject to any disclaimer, the term of this patent is extended or adjusted under 35 U.S.C. 154(b) by 143 days.

(21) Appl. No.: 17/061,972

(22) Filed: Oct. 2, 2020

(65) Prior Publication Data
US 2021/0104378 A1 Apr. 8, 2021

Related U.S. Application Data

(60) Provisional application No. 62/910,785, filed on Oct. 4, 2019.

(51) Int. Cl.
*H01J 37/00* (2006.01)
*H01J 37/317* (2006.01)
*H01J 37/32* (2006.01)
*H01J 37/24* (2006.01)

(52) U.S. Cl.
CPC ........ *H01J 37/3171* (2013.01); *H01J 37/243* (2013.01); *H01J 37/32715* (2013.01); *H01J 2237/24535* (2013.01); *H01J 2237/24564* (2013.01)

(58) Field of Classification Search
CPC .............. H01J 37/3171; H01J 37/243; H01J 37/32715; H01J 2237/24535; H01J 2237/24564; H01J 37/244; H01J 2237/24405; H01J 2237/31705; H01J 2237/022; H01J 37/026; H01J 37/08; H01J 37/248; H01L 21/67011
USPC ........................................... 250/492.1–492.3
See application file for complete search history.

(56) References Cited

U.S. PATENT DOCUMENTS

| 4,361,762 A * | 11/1982 | Douglas | H01J 37/3171 378/160 |
| 6,723,998 B2 * | 4/2004 | Bisson | H01J 37/244 250/397 |
| 7,377,228 B2 * | 5/2008 | Mack | H01J 37/317 250/492.23 |

(Continued)

*Primary Examiner* — Michael Maskell
(74) *Attorney, Agent, or Firm* — Dentons US LLP

(57) ABSTRACT

The invention provides a bias voltage to the component (such as the Faraday cup) for reducing the generation of particles, such as the implanted ions and/or the combination of the implanted ions and the material of the component, and preventing particles peeling away the component. The strength of the biased voltage should not significantly affect the implantation of ions into the wafer and should significantly prevent the emission of radiation and/or electrons away the biased component. How to provide and adjust the biased voltage is not limited, both the extra voltage source and the amended Pre-Amplifier are acceptable. Moreover, due to the electric field generated by the Faraday cup is modified by the biased voltage, the ion beam divergence close to the Faraday cup may be reduced such that the potential difference between the ion beam measured by the profiler and received by the Faraday cup may be minimized.

51 Claims, 6 Drawing Sheets

(56) References Cited

U.S. PATENT DOCUMENTS

| | | | |
|---|---|---|---|
| 2002/0070347 A1* | 6/2002 | Bisson | H01J 37/244 250/423 R |
| 2002/0130275 A1* | 9/2002 | Mack | H01J 37/317 250/492.1 |
| 2003/0197132 A1* | 10/2003 | Keum | H01J 37/3171 250/397 |
| 2003/0222227 A1* | 12/2003 | Richards | H01J 37/244 250/397 |
| 2008/0142727 A1* | 6/2008 | Ryding | H01J 37/244 250/400 |
| 2013/0057250 A1* | 3/2013 | Kopalidis | G01R 19/0061 324/71.3 |

* cited by examiner

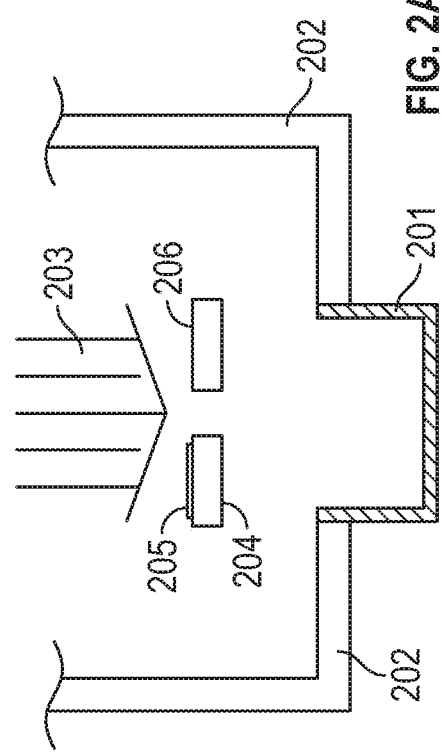
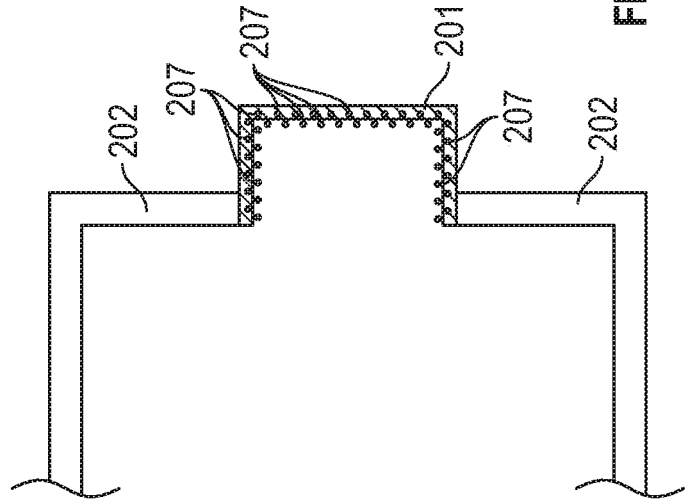
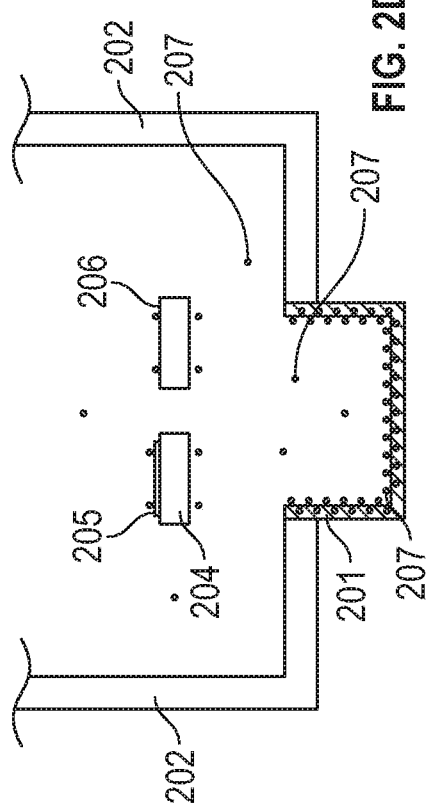
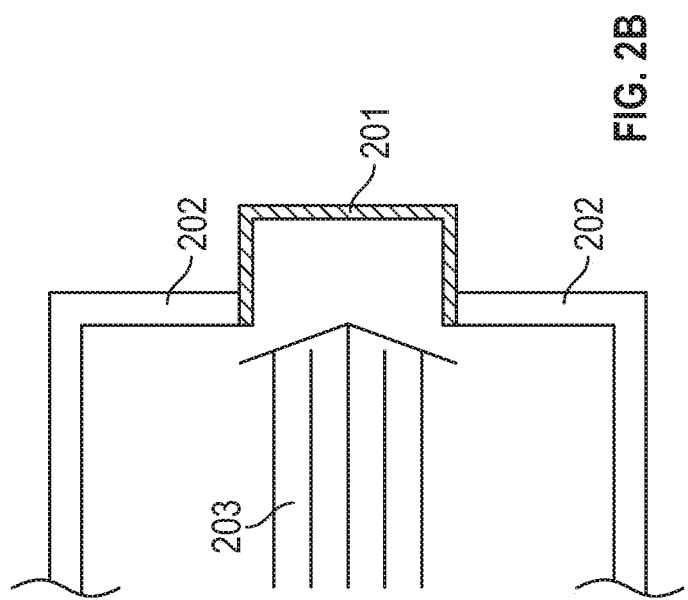

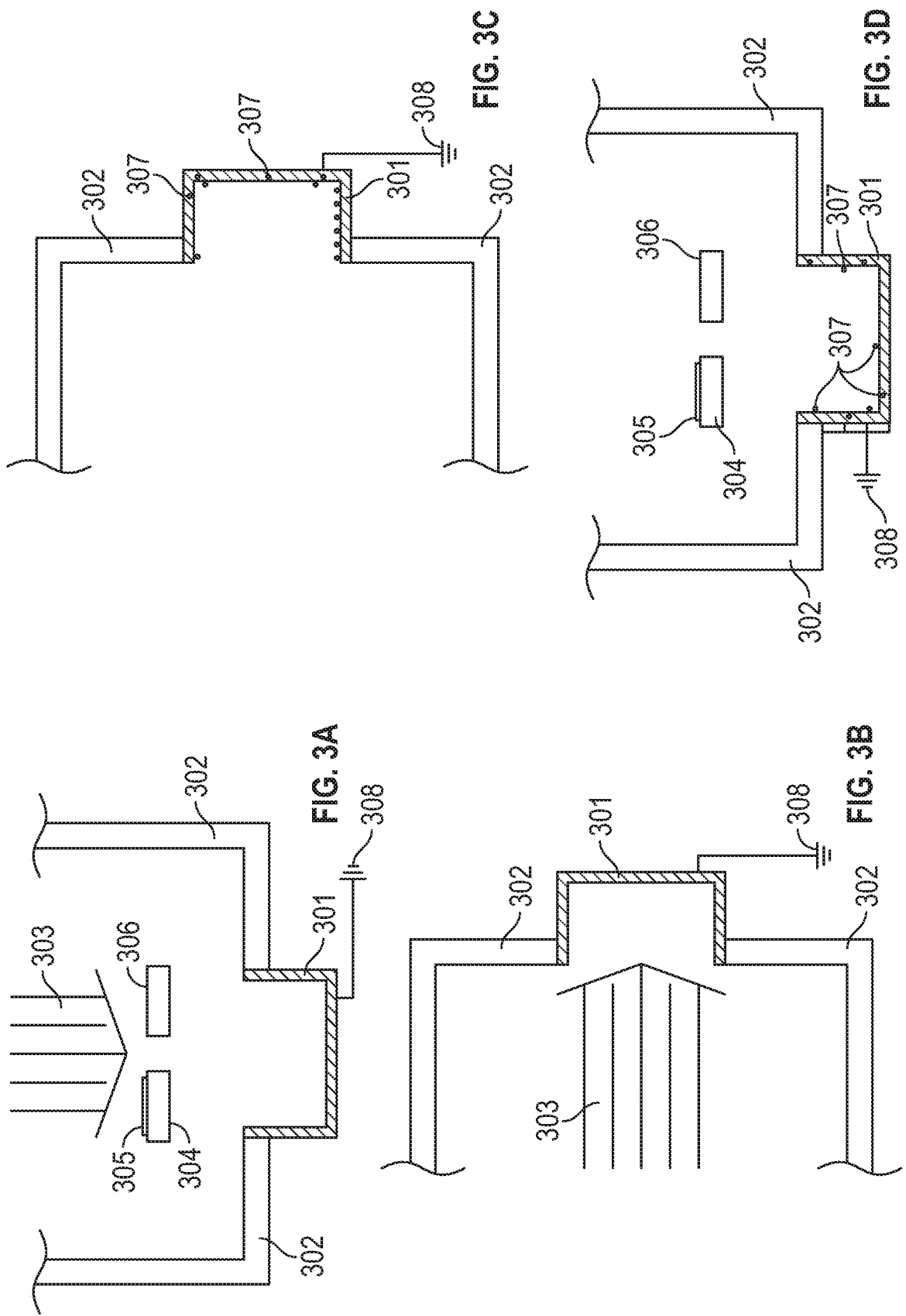

APPARATUS AND METHOD FOR REDUCTION OF PARTICLE CONTAMINATION BY BIAS VOLTAGE

CROSS-REFERENCE TO RELATED APPLICATIONS

This application claims the benefit of U.S. Provisional Patent Application Ser. No. 62/910,785, entitled "APPARATUS AND METHOD FOR REDUCTION OF PARTICLE CONTAMINATION BY BIAS VOLTAGE", filed Oct. 4, 2019, the content of which is hereby incorporated by reference in its entirety for all purposes.

FIELD OF THE INVENTION

The invention is the improvement of the ion implanter and the ion implantation, especially is related to the improvement of using the bias voltage to reduce the particle contamination during the low energy ion implantation.

BACKGROUND OF THE INVENTION

Techniques of ion implantation has been popularly applied in the production of modern products, such as integrated chips, volatile or non-volatile memories, flat panels, solar cells, and so on. Therefore, continual improvements to the structure of ion implanters that could accommodate different ion implantation processes are strongly desired.

In recent years, there has been an increasing demand for low-energy ion implantation, such as the ion implantation with the ion energy less than 1000 eV. Such a demand has made the need of preventing particle contamination from internal components (such as Faraday cup, chuck or electrodes/magnets configured to modify the ion beam) struck by ions even more critical. In general, the depth of ion implantation is proportional to the implanted energy of the ions to be implanted. For this reason, the decrease of energy of implanted ions used in low-energy ion implantation in consequence reduces the implant depth of ions. Compared with high-energy ion implantation where ions with higher energy but of the same dosage are distributed from the surface to a deeper portion of an internal component, implanted ions in low-energy ion implantation would massively aggregate on the surface or shallower portion of the component. Constant and repeated low-energy ion implantation will cause more and more ions depositing on the surface or shallower portion of the component. Consequently, these aggregated debris are prone to peeling off during the next round of low-energy ion implantation when the ion beam continuously strikes on the component. Further, the peeling may continue after the cease of the low-energy ion implantation. The peeled-off and exiled debris may drift or enter into the interior of a process chamber and cause particle contamination. Therefore, there has been an urgent need to reduce or eliminate the debris peeling off from internal components when a low-energy ion implantation process is applied.

SUMMARY OF THE INVENTION

In one embodiment, the invention reduces the problem of particle contamination by utilizing a novel configuration of internal components that may be struck by the ion beam. Internal components may be a Faraday cup configured to receive an ion beam, a chuck configured to hold the wafer, or electrodes/magnets and the plasma flood gun configured to tune the ion beam. These internal components are prone to being struck by ions during ion implantation processes. Among these internal components, a Faraday cup could aggregate the highest amount and concentration of particles because the ion beam frequently strikes it during ion implantation processes. The particle contamination is even worse in a situation where there is a short or close distance between the Faraday cup and the wafer held by the chuck.

In one embodiment, the invention reduces the problem of particle contamination by applying a bias voltage to components struck by (or viewed as having reacted with) the ion beam, especially to plates of the Faraday cup which are designed to directly receive the ion beam. Reasonably, the applied bias voltage increases the implanted energy of ions after these ions pass through the chuck. These ions with increased energy are strongly drawn to and struck onto the biased plates. Accordingly, the distribution of these ions may penetrate to a deeper portion of these plates of the Faraday cup. Hence, the formation of particles on the surface or shallower portion of plates may be effectively reduced, and the combination of the implanted ions and materials of the internal component in turn could be avoided. It should be emphasized that the applied bias voltage should be limited so that the implanted energy of the ions implanted into the wafer is essentially unaffected since the wafer held by the chuck is positioned close to the Faraday cup. Similarly, the applied bias voltage should be limited so that the delivery of the ion beam is essentially unaffected while the ion beam is ideally delivered through the neighborhood of the component. In addition, the applied bias voltage also may somewhat attract these particles. Accordingly, the probability of particles peeling off from any internal component may be reduced, and the particle contamination in the vacuum environment inside the ion implanter may be correspondingly reduced.

The potential of Faraday cups in commercially-available ion implanters are kept at ground (i.e. 0 voltage) so as to ensure a precise measurement of the beam current of the ion beam received by the Faraday cup. Such configuration is essentially fine while these implanted ions are distributed from the surface of the plates into the deep interior portion of the plates of the Faraday cup, but this configuration will face non-negligible particle contamination when low-energy ion implantation processes are applied, as has become common in recent years. In particular, when low-energy ion implantation processes are applied these particles aggregate on the surface or shallow portions of these plates of the Faraday cup. In contrast, the invention applies a bias voltage to these plates of the Faraday cup so that implanted ions are distributed from the surface to the deeper portions of these plates. Note that the implantation energy of these ions implanting into a wafer is not altered by the bias voltage applied to the Faraday cup. Instead, ions passing by the chuck and profiler and marching to the biased Faraday cup will be accelerated and the energy will thus be altered at this stage. Accordingly, the invention may more effectively prevent the particle contamination without any obvious side-effect.

In general, the strength of the bias voltage may be inversely proportional to the ion beam energy because the implanted depth of these implanted ions is proportional to the ion beam energy, and the strength of the bias voltage is proportional to the ion beam current because the concentration of the implanted ions is proportional to the ion beam current. In addition, the polarity of the bias voltage may be opposite to the polarity of implanted ions or particles formed in/on the implanted component. Of course, the quantitative adjustment of the bias voltage is dependent on the details of at least the ion beam and the component which may be implanted by (or viewed as having reacted with) the ion beam. In other words, the quantitative adjustment of the bias voltage is adjusted case by case.

It should be emphasized that the strength of the bias voltage should be controlled properly to ensure the ion implantation on the wafer held by the e-chuck adjacent to the Faraday cup may be performed correctly, and to ensure the ion beam may be delivered properly from the ion source to both the wafer and the Faraday cup. Hence, any side effect without positive benefits may be avoided. Particularly, the strength of the bias voltage should be controlled so that radiation and/or the emission of electrons is reduced and other charged particles are not released.

Besides, the invention does not limit how to provide and control the bias voltage. For example, it may be achieved by simply connecting a desired power supply to plates of Faraday cups. Alternatively, a calibration circuit may be optionally applied if the output voltage of the power supply needs calibration to meet the desired bias voltage. It also may be achieved by modifying the firmware/software of both the pre-amplifier and the controller (e.g., a programmable multi axis controller/input-and-output controller (PMAC/IOC)) used by the commercial Faraday cup.

Furthermore, by applying a bias voltage, the invention may modify the trajectory of ions passing through the process chamber and inhibit the divergence of ions. Ions passing through the process chamber are inhibited, redirected and collected by the Faraday cup, and the proportion of the ion beam not received by the Faraday cup after passing through the position where the wafer is being implanted would be significantly reduced. One main reason is that the applied bias voltage may change the electric field close to the Faraday cup, and the shape of the Faraday cup also could cause the spatial-intensity distribution of the induced electric field close to the edge of the Faraday cup having more intense change than the portion of the electric field away from the edge of the Faraday cup. Accordingly, the generation and change of electric field contributes to more precise measurement of Faraday cup. It should be noted that the applied bias voltage accelerates the velocity of these ions delivered close to the Faraday cup, i.e., increases the implanted energy of these ions implanted into these plates of the Faraday cup, while the ion beam energy is not changed before the ion beam is delivered through the position where the wafer may be implanted.

BRIEF DESCRIPTION OF THE DRAWINGS

FIG. 2A to FIG. 2D show the operation of a conventional Faraday cup after low-energy ion implantation and the particle distribution within the vacuum environment.

FIG. 3A to FIG. 3D show the operation of the proposed biased Faraday cup after low-energy ion implantation and the particle distribution within the vacuum environment.

DETAILED DESCRIPTION OF THE INVENTION

Figure 1B:
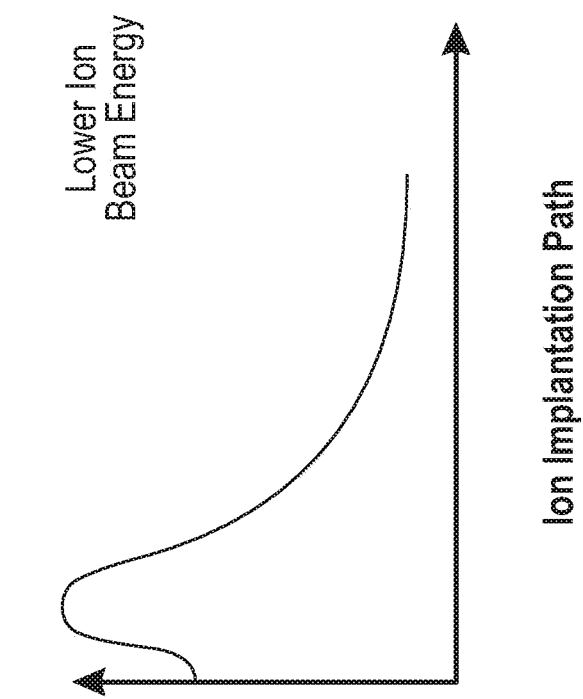
FIG. 1A to FIG. 1B show how the ion implantation depth and ion implantation concentration vary with different ion beam energies.
Figure 1A:
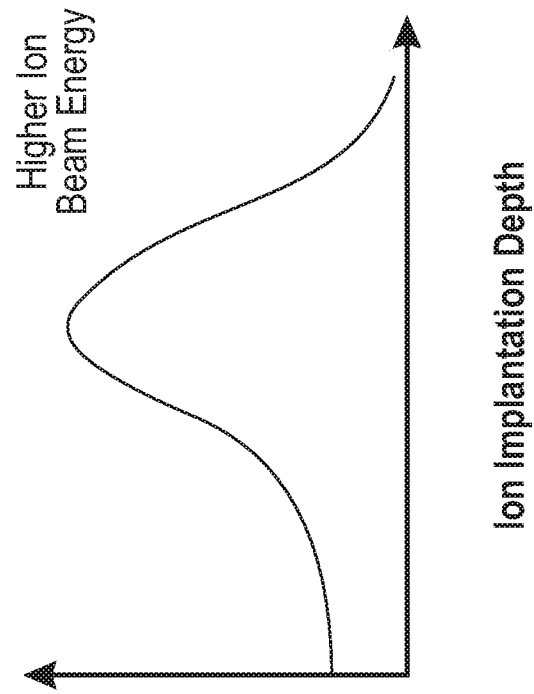

The physical mechanism of the problem to be solved by the present invention may be briefly summarized below. The ion implantation depth (the doped depth) is inversely proportional to the ion beam energy (the doped energy), and the ion implantation concentration is correspondingly proportional to the ion implantation current. Refer to FIG. 1A to FIG. 1B which show how the relation between ion implantation depth and ion implantation concentration vary with the different ion beam energies respectively. Reasonably, when the ion beam energy is low enough, the distribution of the implanted ions will concentrate massively close to the surface of an implanted component. Thus, not only may the shallower portion of the implanted component be strongly damaged by the existence of a large amount of implanted ions, but also a number of particles (for example, the implanted ions themselves or the combination of the implanted ions and the materials of the implanted components) may be peeled off from the implanted components and float into the vacuum environment where a wafer is being held for ion implantation. Hence, a particle contamination phenomenon inside the ion implanter unavoidably happens.

Along with the increased requirements of low-energy ion implantation, some experiments in recent years have shown that such particle contamination phenomenon could get worse rapidly when the ion beam energy is deceased from several KeV to several hundred eV. For example, experiments show that ion implantation with the ion beam energy between 200 eV to 500 eV could have a remarkable increase in particle contamination. The phenomenon of particle contamination is more serious in the interior of the Faraday cup facing the vacuum environment because it is close to the wafer held by the e-chuck, and also because the ion beam is continuously striking the Faraday cup during ion implantation. Furthermore, such particle contamination also may be obvious on other portions of the vacuum environment inside an ion implanter because the ion beam may sometimes strike on electrodes/magnets, a plasma flood gun, or the mass analyzer during the period of beam-tuning.

FIG. 2A to FIG. 2D illustrates how the particle contamination happens and why the particle contamination is worse in the vacuum environment close to the Faraday cup in commercially-available ion implanters. FIG. 2A illustrates the schematic end station incorporating Faraday cup 201 in commercially-available ion implanters. As shown in FIG. 2A, the Faraday cup 201 is embedded in the chamber wall 202 of the ion implanter and faces the ion beam 203. The chuck 204 configured to hold a wafer 205 to be implanted and the profiler 206 configured to monitor the ion beam dose are positioned on the same plane vertical to the ion beam 203. The chuck 204 moves back and forth along the plane, while the profiler 206 moves along the plane to detect ion beam current. To simplify drawings, the Faraday cup 202 is represented as a cup-shaped structure where the bottom and sidewalls of the cup-shaped structures correspond to multiple plates configured to receive the ion beam 203. The circuits configured to measure and analyze the current of the received ion beam is omitted. As shown in FIG. 2B, the ion beam 203 is intermittently delivered into the Faraday cup 201 during the intervals when the chuck 204 with wafer 205 moves back and forth along a scan direction. The ion beam 203 is thus not blocked by the wafer 205 (or the chuck 204) and the profiler 206 and directly strikes on the Faraday cup 201 during the intervals. As shown in FIG. 2C, during the period of ion implantation, a substantial amount of particles 207 are formed in and/or on the inner surface of the Faraday cup 201 according to the mechanism discussed above. As shown FIG. 2D, during and after the finish of the ion implantation, some of these particles 207 may be peeled off from the inner surface of the Faraday cup 201. The peeled-off debris may drift or float to the vacuum environment enclosed by the chamber wall 202, even may be moved to the chuck 204, the wafer 205 and/or the profiler 206 and then induces some corresponding damage to these components.

FIG. 3A to FIG. 3D illustrate how the particle contamination is prevented and why there is no significant particle contamination in Faraday cup 301 facing the vacuum environment of a process chamber. FIG. 3A illustrates the schematic end station incorporating Faraday cup 301 which is configured according to an embodiment of the proposed invention. FIG. 3B to FIG. 3C illustrate the formation and the distribution of some particles 307 during ion implantation. Note that FIG. 3A, FIG. 3B and FIG. 3C are essentially similar to FIG. 2A, FIG. 2B and FIG. 2C respectively except that the existence of the bias voltage source 308 is configured to apply a bias voltage to the Faraday cup 301. During the period of ion implantation, some particles 307 are formed in and/or on the inner surface of the Faraday cup 301 according to the mechanism discussed above. Due to the application of the bias voltage source 308, the amount of these particles 307 is significantly less than that of particles 207 in FIG. 2D because the applied bias voltage may increase the implanted energy of these ions striking into the Faraday cup 301 and distribute these implanted ions into a deeper portion of the Faraday cup 301. Additionally, the applied bias voltage may somewhat attract these particles 307 nearby the Faraday cup 301 and further prevent the floating or drifting of these particles 307 back to the process chamber. FIG. 3D is the schematic drawing showing the result of particle contamination after applying the configuration of the proposed invention. To compare FIG. 3D with FIG. 2D, it's found that only a small number of particles 307 are formed on the surface of the interior of the Faraday cup 301. In other words, by applying a bias voltage to bias the Faraday cup 301 as proposed by the invention, the particle contamination is effectively prevented because little or none of the particles 307 may be peeled away from the inner surface of the Faraday cup 301. Accordingly, the floating and drifting of particles or debris into the vacuum environment enclosed by the chamber wall 302 is greatly reduced. Accordingly, the number of particles 307 moving to the chuck 304, the wafer 305 and/or the profiler 306 is effectively reduced.

Figure 4B:
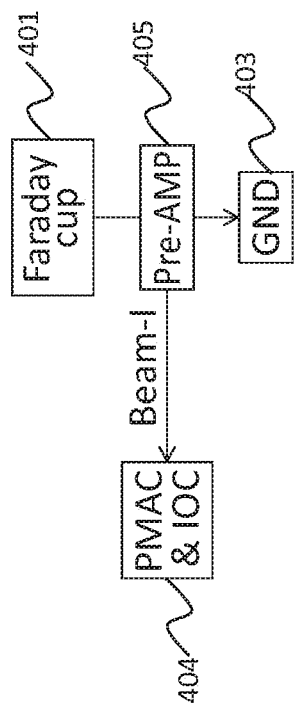
FIG. 4A to FIG. 4C are embodiments of potential configurations of commercially-available Faraday cups applied with a bias voltage.
Figure 4C:
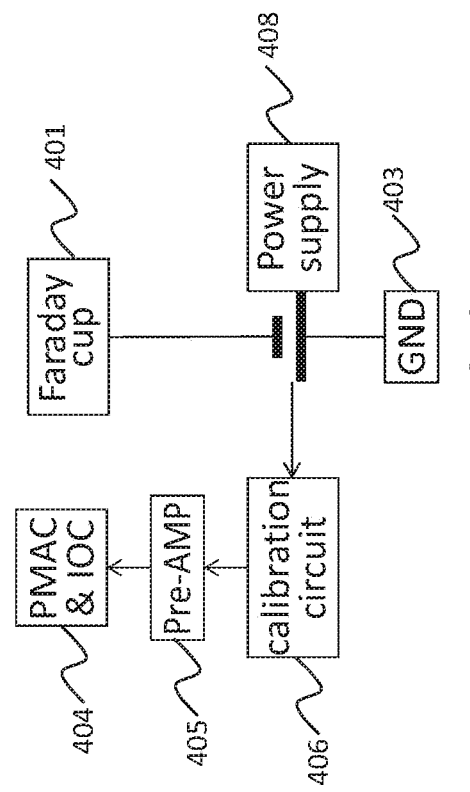
Figure 4A:
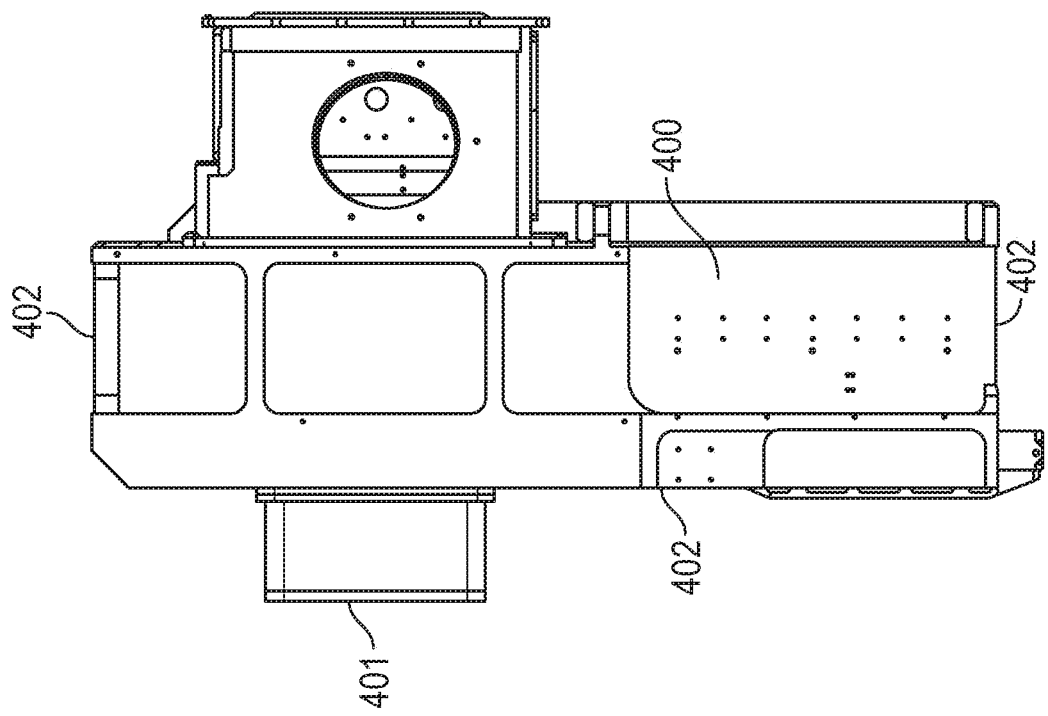

For example, FIG. 4A briefly illustrates a simplified configuration of a process chamber 400 and a Faraday cup 401 within an ion implanter using the proposed invention to bias the Faraday cup. In this embodiment, the Faraday cup 401 is biased to a negative voltage. The negative bias voltage applied could range from negative several hundred volts to negative thousands volts while the chamber wall 402 enclosing the vacuum space in which a chuck and a profiler, which is a sensor, are positioned and move is kept grounded (i.e. 0 Voltage).

In some embodiments, the profiler may be a microchannel plate, a camera, or similar sensor and thus is capable of determining an intensity of the ion beam, a current of the ion beam, a cross section of the ion beam, an image of the ion beam, etc. Accordingly, the profiler can be configured to provide information about the ion beam indicating whether the ion beam is being properly delivered and thus allowing for the monitoring of the ion beam in relation to the ion implantation system. In some embodiments, the profiler of the system includes multiple sensors. For example, the profiler may include both a microchannel plate and a camera and thus be capable of determining a current of the ion beam and an image of the ion beam simultaneously, which may further be used to adjust the ion beam as needed.

FIG. 4C presents an example of providing a bias voltage to the Faraday cup. FIG. 4B corresponds to the current commercial ion implanter and briefly illustrates the circuits configured to match the Faraday cup and to analyze the received ion beam. In FIG. 4B, the pre-AMP (pre-amplifier) 405 is electrically coupled to the Faraday cup 401 and the GND (voltage ground) 403 respectively. The measured result of the received ion beam is transmitted to the controller (e.g., PMAC&IOC) 404. In contrast, FIG. 4C corresponds to the Faraday cup 401 improved by using the proposed invention and briefly illustrates the circuits configured to match the Faraday cup 401 and to analyze the received ion beam. The power supply 408 is electrically coupled to the Faraday cup 401, the calibration circuit 406 and the GND 403 respectively, and the Pre-AMP 405 is electrically coupled with the calibration circuit 406 and the controller 404 respectively. Clearly, the power supply 408 is configured to apply a desired bias voltage to the Faraday cup 401, and the calibration circuit 406 is configured to adjust the operation of the Pre-AMP 405 so as to exclude the effect of the bias voltage on the measured current of received the ion beam. In this way, the signals transferred to the controller 404 are not affected by the usage of the power supply 408.

However, the invention does not limit how to provide a bias voltage. For example, in a non-illustrated example, a power supply is waived and a calibration circuit with a built-in database recording the relation between how a quasi-voltage applied to the Faraday cup and the modification of the operation of the Pre-AMP according to previously processed experiments/simulations is applied. This way, a desired biased Faraday cup may also be achieved and the ion beam current received by the proposed biased Faraday cup may be measured correctly. Similarly, in some non-illustrated examples, other internal components of an ion implanter may be simply biased by using a power supply because their function is irrelevant to receiving and measuring the ion beam.

Further, the strength of the applied bias voltage is decided by at least the practical designs of the component (especially Faraday cup) and the practical operation of the ion implantation. It should be high enough to prevent the formation of these particles and to prevent these particles from peeling away from the component so as to eliminate or prevent particle contamination. Also, it should be adequately adjusted or tuned to avoid an emission of radiation and/or charged particles (i.e. electrons) from the Faraday cup to prevent any undesired side effect. For example, it should be low enough to avoid the harmful risk to operators of an ion implanter by the emitted radiation. Depending on the applied recipes of ion implantation, the bias voltage should not exceed a threshold to affect or change the recipes or beam path delivered inside the vacuum environment.

Figure 5:
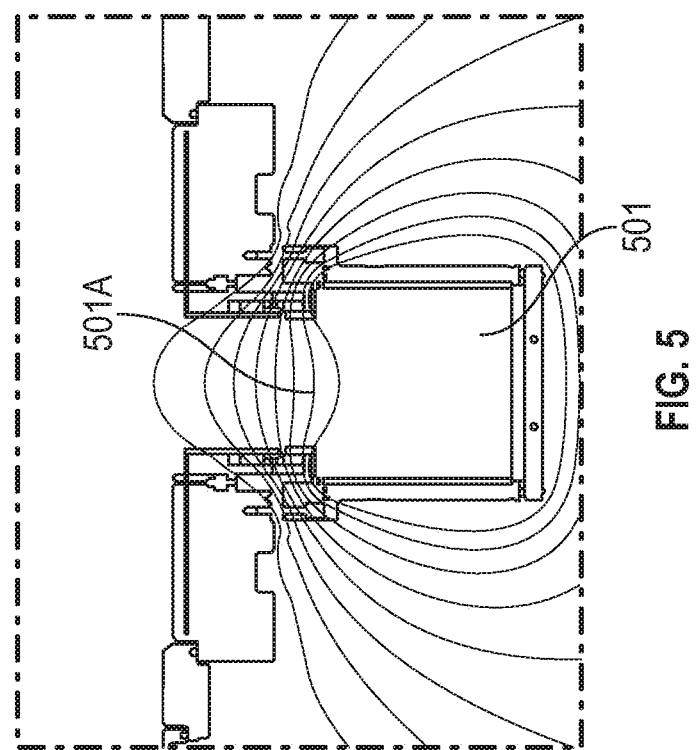
FIG. 5 is a computer stimulation of the distribution of electric potential isolines induced by a bias voltage applied to the Faraday cup.

Significantly, a bias voltage applied to the Faraday cup automatically changes the electric field distributed in the neighboring vacuum environment. FIG. 5 shows a computer simulation result of the electric potential isoline distribution induced by a bias voltage applied to the Faraday cup 501 (the cup-shaped structure). As shown in FIG. 5, these potential isolines are densely distributed and rapidly reduced from higher electric potential to lower electric potential close to the opening of the Faraday cup 501, especially at the edge of the Faraday cup opening. In contrast, these potential isolines are sparsely distributed and slowly reduced from higher electric potential to lower electric potential away from the Faraday cup 501. In particular, in the portion opposite to the Faraday cup opening 501A, the distribution of potential isolines gradually decreases from higher electric potential to lower electric potential in a bubble-like shape. According to the simulated result shown in FIG. 5, the ion beam path is correspondingly modified by the bias voltage applied to the Faraday cup 501 because the electric field direction is vertical to each of these potential isolines. Particularly, due to the distribution of these potential isolines, any ion delivered close to the Faraday cup opening 501A will be drawn into the center of the Faraday cup opening 501A. Moreover, any ion delivered close to the outer side of the Faraday cup opening 501A may be deflected and drawn into the inner space enclosed by the Faraday cup 501. Therefore, ions delivered in broad ribbon-beam shape toward the Faraday cup 501 may be re-shaped to a narrower ribbon-beam to be received by the biased Faraday cup.

Figure 6A:
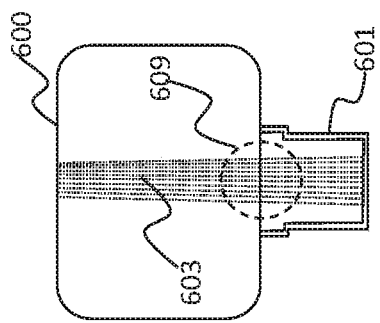
FIG. 6A to FIG. 6B schematically show cross-sectional views of ion beam shape in a first (long) dimension and a second (short) dimension of a ribbon-shaped ion beam in a vacuum environment with a conventional Faraday cup.
Figure 6B:
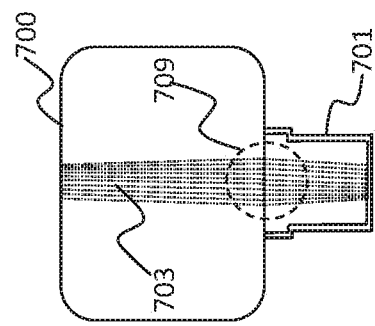

FIG. 6A and FIG. 6B are the cross-sectional views of the ribbon-shaped ion beam 603 passing through a process chamber 600 to a Faraday cup 601 which is kept at ground (i.e. without applying a bias voltage to the Faraday cup 601). FIG. 6A is a cross-sectional view from a first dimension (long dimension) of the ribbon-shaped ion beam 603, whereas FIG. 6B is a cross-sectional view from a second dimension (short dimension) of the ribbon-shaped ion beam 603. As shown in FIG. 6A and FIG. 6B, the Faraday cup 601 is kept grounded, and the energy of the ribbon-shaped ion beam 603 is kept at a positive voltage no matter it is inside the process chamber 600 or enters into the Faraday cup 601. The contour of the ribbon-shaped ion beam 603 and its direction is maintained substantially the same from the process chamber 600 to the bottom of the Faraday cup 601, despite that a small deviation of ion beam might appear due to space-charge effect.

Figure 7A:
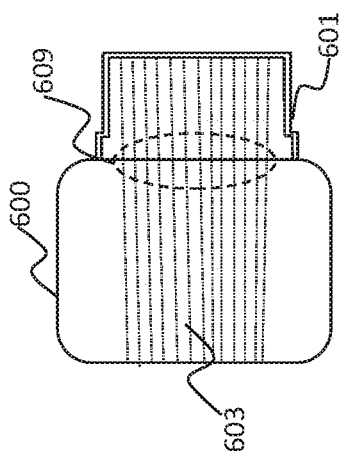
FIG. 7A to FIG. 7B schematically show cross-sectional views of ion beam shape in a first (long) dimension and a second (short) dimension of a ribbon-shaped ion beam in a vacuum environment with a biased Faraday cup.
Figure 7B:
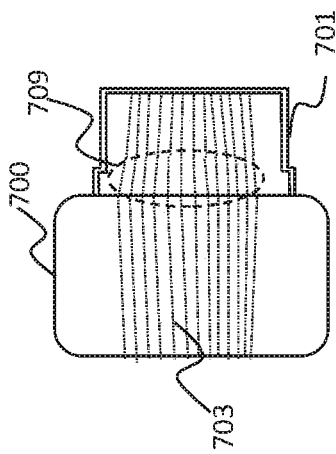

FIG. 7A and FIG. 7B are the cross-sectional views of a ribbon-shaped ion beam 703 passing through a process chamber 700 to a Faraday cup 701. FIG. 7A and FIG. 7B are similar to FIG. 6A and FIG. 6B, except that a negative bias voltage is applied to the Faraday cup 701. In this embodiment, the Faraday cup 701 is maintained at a desired negative bias voltage. The ion beam 703 passing through the process chamber 700 is thus accelerated by the bias voltage and the potential voltage of these ions implanted into the bottom of the Faraday cup 701 is adjusted to a negative voltage. Due to the change of electric potential and attraction by the negative bias voltage applied in the Faraday cup 701, the shape of the ion beam 703 is substantially altered or narrowed in portion 709 of FIG. 7A and FIG. 7B. The convergence and reshape of ribbon-shaped ion beam 703 in the first and the second dimensions could ensure a more precise measurement of total beam current of the ion beam 703.

Figure 8B:
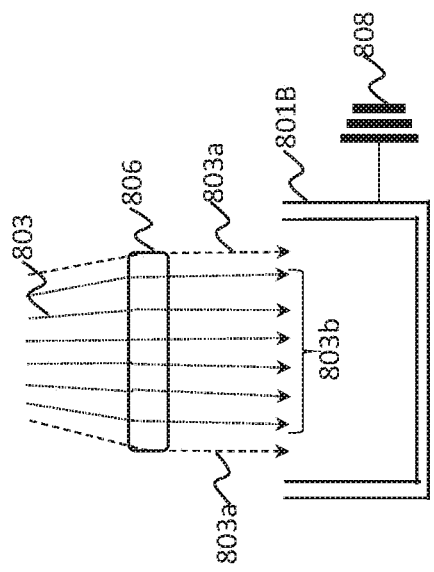
FIG. 8A to FIG. 8B schematically show the comparison of change of ion beam shape between a conventional Faraday cup and a biased Faraday cup.
Figure 8A:
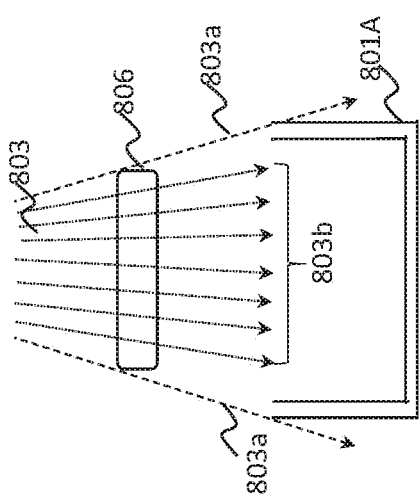

The present invention may have benefits more than merely preventing particle contamination because the biased Faraday cup may narrow or alter shape of the ion beam as shown in FIG. 8B. FIG. 8A schematically shows a ribbon-shaped ion beam 803, a profiler 806, and an un-biased Faraday cup 801A. FIG. 8B is similar to FIG. 8A, except that a bias voltage 808 is applied to the Faraday cup 801B. Due to the aforementioned effect of a bias voltage 808 used to bias the Faraday cup 801B, ion beams 803a that could have diverged and deviated out of the Faraday cup 801A when there is no bias voltage applied can now be deflected near the opening of the biased Faraday cup 801B and be re-collected. Of course, ion beams 803b passing through the process chamber which do not diverge or deviate would still march along the beam path and strike on the bottom of the biased Faraday cup 801B as usual. As a result, it is shown by FIG. 8A and FIG. 8B that the total ion beam received by the un-biased Faraday cup 801A may be different from the total ion beam received by the profiler 806 since in FIG. 8A, the ion beam 803 widens gradually after it passes through the plane where the profiler (206, 306, 806) and the chuck (204, 304) are positioned. Significantly, by biasing the Faraday cup as proposed by the invention, the ion beam received by the biased Faraday cup 801B may be almost equal to the ion beam received by the profiler 806 because the divergence of ion beam is inhibited after it passes through the plane where the profiler (206, 306, 806) and the chuck (204, 304) are positioned. The additional benefit of the present invention is that the profiler and the biased Faraday cup could measure ion beam in substantially equivalent amount. Accordingly, the total ion beam current measured by the biased Faraday cup may fully reflect the total ion beam dose measured by the profiler.

To sum up, a method of reducing particle contamination during low-energy ion implantation is proposed. The steps comprise identifying an internal component of an ion implanter that accumulates particles exceeding a predetermined threshold during low-energy ion implantation. Next, the steps further comprise applying a desired bias voltage to the identified component during the period of low-energy ion implantation. The application of a desired bias voltage to the identified component can continue or last after the cease of the low-energy ion implantation. The desired voltage applied in the identified component is opposite to the energy of ions in the ion beam so as to attract or accelerate ions toward the identified component. Depending on the recipes of low-energy ion implantation, the desired voltage could range from hundreds of voltages to several thousand voltages.

Obviously, the construction details and the embodiments may widely vary with respect to what has been described and illustrated, without departing from the scope of protection of the invention.

What is claimed is:

1. An ion implantation system, comprising:
   an ion beam generator configured to generate an ion beam;
   a wafer chuck configured to hold a wafer;
   a Faraday cup configured to receive at least a portion of the ion beam;
   a bias voltage source electrically connected to the Faraday cup, wherein the bias voltage source is configured to apply a bias voltage to the Faraday cup when an ion beam is delivered from the ion beam generator to the wafer;

a pre-amplifier electrically connected to the Faraday cup, wherein the pre-amplifier is configured to measure a voltage of the Faraday cup; and a controller electrically connected to the pre-amplifier, wherein the controller is configured to adjust a current of the ion beam based on the measured voltage of the Faraday cup.

2. The ion implantation system of claim 1, further comprising:

one or more plates embedded in the Faraday cup, wherein the bias voltage source is electrically connected to the one or more plates.

3. The ion implantation system of claim 1, further comprising:

a vacuum chamber enclosing the wafer chuck and the Faraday cup, wherein a wall of the vacuum chamber is electrically grounded.

4. The ion implantation system of claim 1, further comprising:

a sensor configured to monitor the ion beam delivered by the ion beam generator.

5. An ion implantation system, comprising:

an ion beam generator configured to generate an ion beam;

a wafer chuck configured to hold a wafer;

a Faraday cup configured to receive at least a portion of the ion beam;

a bias voltage source electrically connected to the Faraday cup, wherein the bias voltage source is configured to apply a bias voltage to the Faraday cup when an ion beam is delivered from the ion beam generator to the wafer and, wherein the bias voltage source is a power supply electrically connected to the Faraday cup;

a calibration circuit electrically connected to the power supply and a pre-amplifier, wherein the calibration circuit is configured to adjust an amplification level of the pre-amplifier based on the bias voltage; and a controller electrically connected to the pre-amplifier, wherein the controller is configured to adjust a current of the ion beam based on the amplification level of the pre-amplifier.

6. The ion implantation system of claim 1, wherein the bias voltage source is configured to apply a strength of the bias voltage inversely proportional to an energy of the ion beam.

7. The ion implantation system of claim 6, wherein the bias voltage source is configured to apply the strength of the bias voltage inversely proportional to a current of the ion beam.

8. The ion implantation system of claim 1, wherein the bias voltage source is configured to apply a negative voltage.

9. The ion implantation system of claim 1, wherein the ion beam is a ribbon-shaped ion beam.

10. An ion implantation system, comprising:

an ion beam generator configured to generate a ribbon-shaped ion beam;

a wafer chuck configured to hold a wafer;

a Faraday cup configured to receive at least a portion of the ion beam;

a bias voltage source electrically connected to the Faraday cup, wherein the bias voltage source is configured to apply a bias voltage to the Faraday cup when an ion beam is delivered from the ion beam generator to the wafer wherein the bias voltage source is configured to apply the bias voltage based on a desired convergence of the ribbon-shaped ion beam.

11. The ion implantation system of claim 10, wherein the Faraday cup is configured to measure a first current of the ion beam, further comprising:

a sensor configured to measure a second current of the ion beam; and a controller electronically connected to the sensor, the Faraday cup, and a power source, wherein the controller comprises memory and one or more processors, and wherein the memory stores one or more programs, the one or more programs comprising instructions, which when executed by the one or more processors, cause the system to:

determine whether the first current of the ion beam is equal to the second current of the ion beam; and in accordance with a determination that the first current of the ion beam is not equal to the second current of the ion beam, adjust the bias voltage provided by the power source.

12. The ion implantation system of claim 11, wherein the one or more programs further comprise instruction, which when executed by the one or more processors cause the system to:

determine, based on the first current of the ion beam and the second current of the ion beam, whether a convergence of the ribbon-shaped ion beam is within a minimum threshold of convergence; and in accordance with a determination that the convergence of the ribbon-shaped ion beam is not within the minimum threshold of the convergence, adjust the bias voltage provided by the power source.

13. The ion implantation system of claim 1, wherein the ion beam generator is configured to provide a low-energy ion beam.

14. The ion implantation system of claim 13, wherein the ion beam generator is configured to provide the ion beam with an energy less than 1000 eV.

15. The ion implantation system of claim 14, wherein the ion beam generator is configured to provide the ion beam with an energy between 200 eV and 500 eV.

16. A method for reducing particle contamination in an ion implantation system, the ion implantation system including an ion beam generator, a wafer chuck configured to hold a wafer, a Faraday cup, a bias voltage source electrically connected to the Faraday cup, a pre-amplifier electrically connected to the Faraday cup, and a controller electrically connected to the pre-amplifier, the method comprising:

delivering an ion beam with the ion beam generator to the wafer;

applying a bias voltage to the Faraday cup with the bias voltage source when an ion beam is delivered from the ion beam generator to the wafer;

determining a voltage of the Faraday cup with the pre-amplifier; and adjusting a current of the ion beam with the controller based on the measured voltage of the Faraday cup.

17. The method of claim 16, wherein one or more plates are embedded in the Faraday cup and electrically connected to the bias voltage source, and applying the bias voltage to the Faraday cup further comprises applying the bias voltage to the one or more plates embedded in the Faraday cup.

18. The method of claim 16, wherein the ion implantation system further includes a vacuum chamber enclosing the wafer chuck and the Faraday cup, further comprising:

applying a ground voltage to a wall of the vacuum chamber.

19. The method of claim 16, wherein the ion implantation system further includes a sensor, further comprising:
determining a current of the ion beam with the sensor.

20. A method for reducing particle contamination in an ion implantation system, the ion implantation system including an ion beam generator, a wafer chuck configured to hold a wafer, a Faraday cup, a bias voltage source electrically connected to the Faraday cup, a calibration circuit electrically connected to the power supply, a pre-amplifier, and a controller electrically connected to the pre-amplifier, wherein the bias voltage source is a power supply electrically connected to the Faraday cup, the method comprising:
delivering an ion beam with the ion beam generator to the wafer;
applying a bias voltage to the Faraday cup with the bias voltage source when an ion beam is delivered from the ion beam generator to the wafer;
adjusting an amplification level of the pre-amplifier with the calibration circuit based on the bias voltage; and
adjusting a current of the ion beam based on the amplification level of the pre-amplifier with the controller.

21. The method of claim 16, wherein a strength of the bias voltage is inversely proportional to an energy of the ion beam.

22. The method of claim 21, wherein the strength of the bias voltage is inversely proportional to a current of the ion beam.

23. The method of claim 16, wherein the bias voltage is a negative voltage.

24. The method of claim 16, wherein the ion beam is a ribbon-shaped ion beam.

25. A method for reducing particle contamination in an ion implantation system, the ion implantation system including an ion beam generator, a wafer chuck configured to hold a wafer, a Faraday cup, a bias voltage source electrically connected to the Faraday cup, the method comprising:
delivering a ribbon-shaped ion beam with the ion beam generator to the wafer; and
applying a bias voltage to the Faraday cup with the bias voltage source when an ion beam is delivered from the ion beam generator to the wafer, wherein the bias voltage is applied based on a desired convergence of the ribbon-shaped ion beam.

26. The method of claim 25, wherein the ion implantation system further includes a sensor and a controller electronically connected to the sensor the Faraday cup, and a power source, further comprising:
measuring a first current of the ion beam with the Faraday cup;
measuring a second current of the ion beam with the sensor;
determining, with the controller, whether the first current of the ion beam is equal to the second current of the ion beam; and
in accordance with a determination that the first current of the ion beam is not equal to the second current of the ion beam, adjusting, with the controller, the bias voltage provided by the power source.

27. The method of claim 26, further comprising:
determining, based on the first current of the ion beam and the second current of the ion beam, whether a convergence of the ribbon-shaped ion beam is within a minimum threshold of convergence; and
in accordance with a determination that the convergence of the ribbon-shaped ion beam is not within the minimum threshold of the convergence, adjusting the bias voltage provided by the power source.

28. The method of claim 16, wherein the ion beam is a low-energy ion beam.

29. The method of claim 28, wherein the ion beam has an energy less than 1000 eV.

30. The method of claim 29, wherein the ion beam has an energy between 200 eV and 500 eV.

31. A non-transitory computer-readable storage medium storing one or more programs, the one or more programs comprising instructions, which when executed by one or more processors of an ion implantation system, cause the ion implantation system to:
deliver an ion beam to a wafer held by a wafer chuck of the ion implantation system with an ion beam generator of the ion implantation system;
apply a bias voltage to a Faraday cup of the ion implantation system with a bias voltage source of the ion implantation system, wherein the bias voltage is applied by the bias voltage source when the ion beam is delivered from the ion beam generator to the wafer;
measure a voltage of the Faraday cup with a pre-amplifier of the ion implantation system electrically connected to the Faraday cup; and
adjust a current of the ion beam with a controller of the ion implantation system electrically connected to the pre-amplifier, based on the measured voltage of the Faraday cup.

32. The non-transitory computer-readable storage medium of claim 31, wherein applying the bias voltage to the Faraday cup further comprises applying the bias voltage to one or more plates embedded in the Faraday cup, wherein the bias voltage source is electrically connected to the one or more plates.

33. The non-transitory computer-readable storage medium of claim 31, wherein the one or more programs further comprise instructions, which when executed by one or more processors of the ion implantation system, cause the ion implantation system to:
apply a ground voltage to a wall of a vacuum chamber of the ion implantation system enclosing the wafer chuck and the Faraday cup.

34. The non-transitory computer-readable storage medium of claim 31, wherein the one or more programs further comprise instructions, which when executed by one or more processors of the ion implantation system, cause the ion implantation system to:
monitor the ion beam delivered by the ion beam generator using a sensor of the ion implantation system.

35. A non-transitory computer-readable storage medium storing one or more programs, the one or more programs comprising instructions, which when executed by one or more processors of an ion implantation system, cause the ion implantation system to:
deliver an ion beam to a wafer held by a wafer chuck of the ion implantation system with an ion beam generator of the ion implantation system;
apply a bias voltage to a Faraday cup of the ion implantation system with a bias voltage source of the ion implantation system, wherein the bias voltage is applied by the bias voltage source when the ion beam is delivered from the ion beam generator to the wafer;
adjust, based on the bias voltage, an amplification level of a pre-amplifier of the ion implantation system with a calibration circuit of the ion implantation system electrically connected to the power supply and the pre-amplifier; and adjust a current of the ion beam based on the amplification level of the pre-amplifier with a controller of the ion implantation system electrically connected to the pre-amplifier.

36. The non-transitory computer-readable storage medium of claim 31, wherein a strength of the bias voltage is inversely proportional to an energy of the ion beam.

37. The non-transitory computer-readable storage medium of claim 36, wherein the strength of the bias voltage is inversely proportional to a current of the ion beam.

38. The non-transitory computer-readable storage medium of claim 31, wherein the bias voltage is a negative voltage.

39. The non-transitory computer-readable storage medium of claim 31, wherein the ion beam is a ribbon-shaped ion beam.

40. A non-transitory computer-readable storage medium storing one or more programs, the one or more programs comprising instructions, which when executed by one or more processors of an ion implantation system, cause the ion implantation system to:
deliver a ribbon-shaped ion beam to a wafer held by a wafer chuck of the ion implantation system with an ion beam generator of the ion implantation system; and
apply a bias voltage to a Faraday cup of the ion implantation system with a bias voltage source of the ion implantation system, wherein the bias voltage is applied by the bias voltage source when the ion beam is delivered from the ion beam generator to the wafer and wherein the bias voltage is based on a desired convergence of the ribbon-shaped ion beam.

41. The non-transitory computer-readable storage medium of claim 40 wherein the one or more programs further comprise instructions, which when executed by one or more processors of the ion implantation system, cause the ion implantation system to:
measure a first current of the ion beam with the Faraday cup;
measure a second current of the ion beam with a sensor of the ion implantation system;
determine whether the first current of the ion beam is equal to the second current of the ion beam with a controller of the ion implantation system; and
in accordance with a determination that the first current of the ion beam is not equal to the second current of the ion beam, adjust the bias voltage provided by a power source of the ion implantation system with the controller.

42. The non-transitory computer-readable storage medium of claim 41, wherein the one or more programs further comprise instructions, which when executed by one or more processors of the ion implantation system, cause the ion implantation system to:
determine, based on the first current of the ion beam and the second current of the ion beam, whether a convergence of the ribbon-shaped ion beam is within a minimum threshold of convergence with the controller; and
in accordance with a determination that the convergence of the ribbon-shaped ion beam is not within the minimum threshold of the convergence, adjust the bias voltage provided by the power source with the controller.

43. The non-transitory computer-readable storage medium of claim 31, wherein the ion beam is a low-energy ion beam.

44. The non-transitory computer-readable storage medium of claim 43, wherein the ion beam has an energy less than 1000 eV.

45. The non-transitory computer-readable storage medium of claim 44, wherein the ion beam has an energy between 200 eV and 500 eV.

46. The ion implantation system of claim 5, wherein the bias voltage source is configured to apply a strength of the bias voltage inversely proportional to an energy of the ion beam.

47. The ion implantation system of claim 10, wherein the bias voltage source is configured to apply a strength of the bias voltage inversely proportional to an energy of the ion beam.

48. The method of claim 20, wherein a strength of the bias voltage is inversely proportional to an energy of the ion beam.

49. The method of claim 25, wherein a strength of the bias voltage is inversely proportional to an energy of the ion beam.

50. The non-transitory computer-readable storage medium of claim 35, wherein a strength of the bias voltage is inversely proportional to an energy of the ion beam.

51. The non-transitory computer-readable storage medium of claim 40, wherein a strength of the bias voltage is inversely proportional to an energy of the ion beam.

* * * * *